United States Patent
Chen et al.

(10) Patent No.: US 9,003,100 B2
(45) Date of Patent: Apr. 7, 2015

(54) REFERENCE FREQUENCY SETTING METHOD, MEMORY CONTROLLER, AND FLASH MEMORY STORAGE APPARATUS

(75) Inventors: Chih-Ming Chen, Hsinchu County (TW); An-Chung Chen, Hsinchu (TW); Wen-Lung Cheng, Taipei (TW)

(73) Assignee: Phison Electronics Corp., Miaoli (TW)

( * ) Notice: Subject to any disclaimer, the term of this patent is extended or adjusted under 35 U.S.C. 154(b) by 104 days.

(21) Appl. No.: 13/104,009

(22) Filed: May 9, 2011

(65) Prior Publication Data

US 2012/0254510 A1      Oct. 4, 2012

(30) Foreign Application Priority Data

Mar. 31, 2011   (TW) .............................. 100111292 A

(51) Int. Cl.
- G06F 1/08   (2006.01)
- G11C 16/20   (2006.01)
- G06F 1/04   (2006.01)
- G06F 3/06   (2006.01)
- G11C 7/22   (2006.01)

(52) U.S. Cl.
CPC ... G06F 1/08 (2013.01); *G06F 1/04* (2013.01); *G06F 3/0679* (2013.01); *G11C 7/222* (2013.01); G11C 16/20 (2013.01)

(58) Field of Classification Search
CPC ..... G06F 3/0679; G06F 12/0246; G06F 1/04; G06F 1/08; G11C 7/222
USPC ......................................................... 711/103
See application file for complete search history.

(56) References Cited

U.S. PATENT DOCUMENTS

| | | | |
|---|---|---|---|
| 3,633,172 A * | 1/1972 | Eggimann et al. ............ | 370/431 |
| 6,753,739 B1 | 6/2004 | Mar et al. | |
| 6,798,299 B1 * | 9/2004 | Mar et al. ......................... | 331/17 |
| 6,937,082 B2 * | 8/2005 | Ishimi ........................... | 327/291 |
| 7,287,199 B2 * | 10/2007 | Chang .............................. | 714/55 |
| 7,583,154 B1 * | 9/2009 | Kizziar ........................... | 331/65 |
| 7,809,973 B2 * | 10/2010 | Sartore et al. ................. | 713/500 |
| 2005/0263977 A1 * | 12/2005 | Pan ................................ | 280/201 |

(Continued)

FOREIGN PATENT DOCUMENTS

| CN | 1329787 C | 8/2007 |
|---|---|---|
| CN | 101174221 A | 5/2008 |

OTHER PUBLICATIONS

"Office Action of Taiwan Counterpart Application", issued on Dec. 9, 2013, p. 1-p. 16.

(Continued)

*Primary Examiner* — Charles Rones
*Assistant Examiner* — Andrew Russell
(74) *Attorney, Agent, or Firm* — Jianq Chyun IP Office

(57) ABSTRACT

A reference frequency setting method of a flash memory storage apparatus is provided. The flash memory storage apparatus includes a flash memory module, a storage unit, and an oscillator circuit without a crystal. The reference frequency setting method includes following steps. Whether a setting code is stored in the flash memory module or the storage unit is determined, wherein the setting code includes information of a reference frequency. If the setting code is stored in the flash memory module, the setting code is read to allow the oscillator circuit to generate the reference frequency according to the setting code. A memory controller and a flash memory storage apparatus using the reference frequency setting method are also provided.

21 Claims, 6 Drawing Sheets

(56) References Cited

U.S. PATENT DOCUMENTS

| | | |
|---|---|---|
| 2007/0110142 A1 | 5/2007 | Sartore et al. |
| 2008/0079465 A1* | 4/2008 | Sung et al. .................... 327/101 |
| 2008/0309383 A1* | 12/2008 | Yada et al. .................... 327/141 |
| 2009/0106484 A1* | 4/2009 | Yeh et al. ....................... 711/103 |
| 2010/0070744 A1* | 3/2010 | Barry et al. ........................ 713/2 |
| 2010/0095106 A1* | 4/2010 | Alexander et al. ................ 713/2 |
| 2012/0084594 A1* | 4/2012 | Chen et al. .................... 713/501 |

OTHER PUBLICATIONS

"First Office Action of China Counterpart Application", issued on Aug. 4, 2014, p. 1-p. 17,

* cited by examiner

REFERENCE FREQUENCY SETTING METHOD, MEMORY CONTROLLER, AND FLASH MEMORY STORAGE APPARATUS

CROSS-REFERENCE TO RELATED APPLICATION

This application claims the priority benefit of Taiwan application serial no. 100111292, filed Mar. 31, 2011. The entirety of the above-mentioned patent application is hereby incorporated by reference herein and made a part of this specification.

BACKGROUND OF THE INVENTION

1. Field of the Invention

The invention generally relates to a reference frequency setting method, and more particularly, to a method of recording a reference frequency into a memory as a firmware, and a memory controller and a flash memory storage apparatus using the same.

2. Description of Related Art

Universal serial bus (USB) devices are very popular and mature products in the consumer market. In order to generate an accurate reference frequency in a USB device, an external circuit (i.e., a crystal oscillator circuit) is usually adopted. If the characteristic of an oscillator circuit in a chip is to be calibrated, conventionally, the manufacturer records the calibration setting in a hardware component (for example, an e-fuse or a trim pad) during the activation procedure. However, crystal oscillator circuit comes at high cost, and the surface area and hardware cost of the USB device will be increased by recording the frequency setting of the oscillator circuit in the chip. Besides, because the hardware component is fused after the USB device is activated, the frequency cannot be changed again. As a result, the competitiveness of the USB device is reduced.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

Accordingly, the invention is directed to a reference frequency setting method, wherein the calibration setting of a reference frequency is recorded in a memory as a firmware so that the hardware cost of a memory storage apparatus is reduced.

The invention is directed to a memory controller, wherein the calibration setting of a reference frequency is recorded in a memory as a firmware so that the hardware cost of a memory storage apparatus is reduced.

The invention is directed to a flash memory storage apparatus, wherein the calibration setting of a reference frequency is recorded in a memory as a firmware so that the hardware cost of a memory storage apparatus is reduced.

The invention provides a reference frequency setting method of a flash memory storage apparatus. The flash memory storage apparatus includes a flash memory module, a storage unit, and an oscillator circuit without a crystal. The reference frequency setting method includes following steps. Whether a setting code is stored in the flash memory module or the storage unit is determined, wherein the setting code includes setting information of the reference frequency. If the setting code is stored in the flash memory module, the setting code is read to allow the oscillator circuit to generate the reference frequency according to the setting code.

The invention provides a memory controller for setting a reference frequency of a flash memory storage apparatus. The flash memory storage apparatus includes a flash memory module and an oscillator circuit. The memory controller includes a memory interface, a memory management circuit, and a storage unit. The memory interface is coupled to the flash memory module. The memory management circuit is coupled to the memory interface. The storage unit is coupled to the memory management circuit. The memory management circuit determines whether a setting code is stored in the flash memory module or the storage unit, wherein the setting code includes information of the reference frequency. If the setting code is stored in the flash memory module or the storage unit, the memory management circuit reads the setting code to allow the oscillator circuit to generate the reference frequency according to the setting code.

The invention provides a flash memory storage apparatus including an oscillator circuit, a flash memory module, and a memory controller. The oscillator circuit is configured to generate a reference frequency according to a setting code. The flash memory module is configured to store the setting code. The memory controller is coupled to the oscillator circuit and the flash memory module. The memory controller includes a storage unit. The memory controller determines whether the setting code is stored in the flash memory module or the storage unit. The setting code includes information of the reference frequency. If the setting code is stored in the flash memory module or the storage unit, the memory controller reads the setting code to allow the oscillator circuit to generate the reference frequency according to the setting code.

These and other exemplary embodiments, features, aspects, and advantages of the invention will be described and become more apparent from the detailed description of exemplary embodiments when read in conjunction with accompanying drawings.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
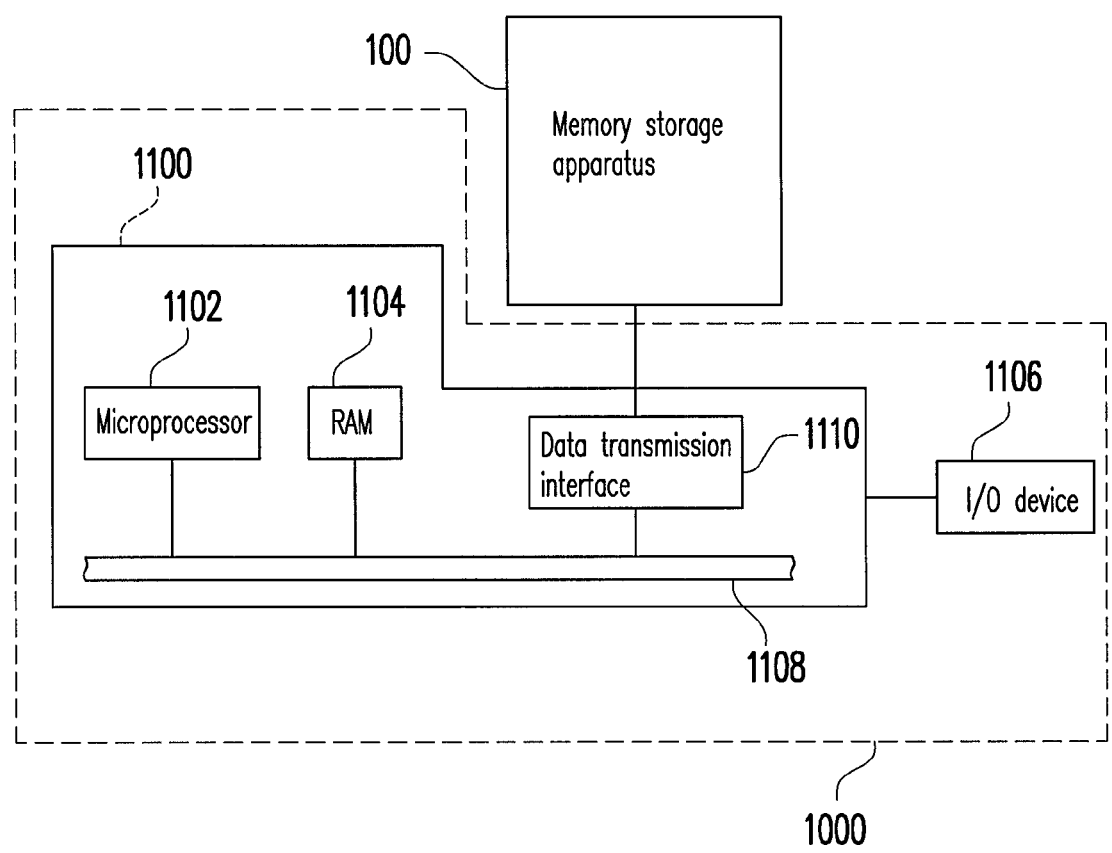
FIG. 1A illustrates a host system and a memory storage apparatus according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

In a reference frequency setting method provided by an exemplary embodiment of the invention, when an activation procedure is executed on a memory storage apparatus, an accurate reference frequency is provided through a host, the frequency setting desired by an oscillator circuit in a chip of the memory storage apparatus is calibrated, and the frequency setting is stored into a flash memory module. Subsequently, when the memory storage apparatus is turned on, the frequency is set to the oscillator circuit in the chip according to the setting code loaded through the activation procedure. After that, the memory storage apparatus can connect to the host correctly. Thereby, the reference frequency setting method provided by an exemplary embodiment of the invention can store the frequency setting into the flash memory module as a firmware so that the hardware cost of the memory storage apparatus is reduced. Below, an exemplary embodiment of the invention will be described in detail with reference to accompanying drawings.

Generally, a memory storage apparatus (also referred to as a memory storage system) includes a rewritable flash memory module and a controller (also referred to as a control circuit). The memory storage apparatus is usually used along with a host system so that the host system can write data into or read data from the memory storage apparatus.

FIG. 1A illustrates a host system and a memory storage apparatus according to an exemplary embodiment of the invention.

Figure 1B:
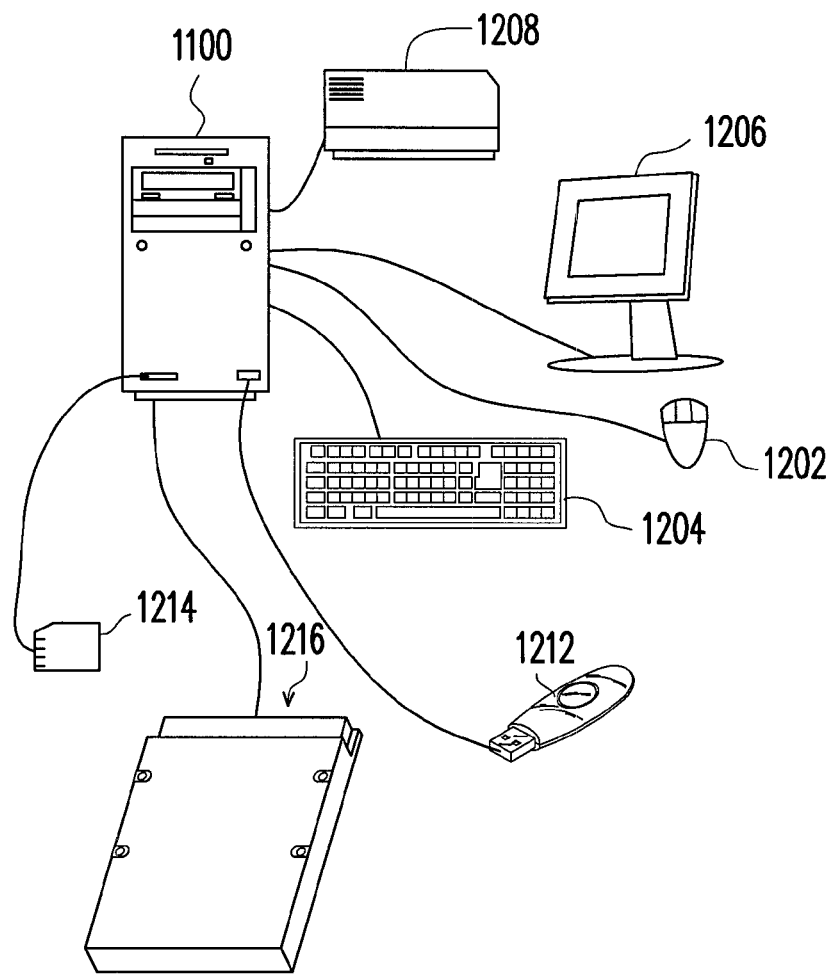
FIG. 1B is a diagram of a computer, an input/output (I/O) device, and a memory storage apparatus according to an exemplary embodiment of the invention.

Referring to FIG. 1A, the host system 1000 usually includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the I/O device 1106 is not limited to the devices illustrated in FIG. 1B and may further include other devices.

In the present embodiment, the memory storage apparatus 100 is coupled to other components of the host system 1000 through the data transmission interface 1110. Data can be written into or read from the memory storage apparatus 100 through the operations of the microprocessor 1102, the RAM 1104, and the I/O device 1106. The memory storage apparatus 100 may be a rewritable flash memory storage apparatus, such as the flash drive 1212, the memory card 1214, or the solid state drive (SSD) 1216 illustrated in FIG. 1B.

Figure 1C:
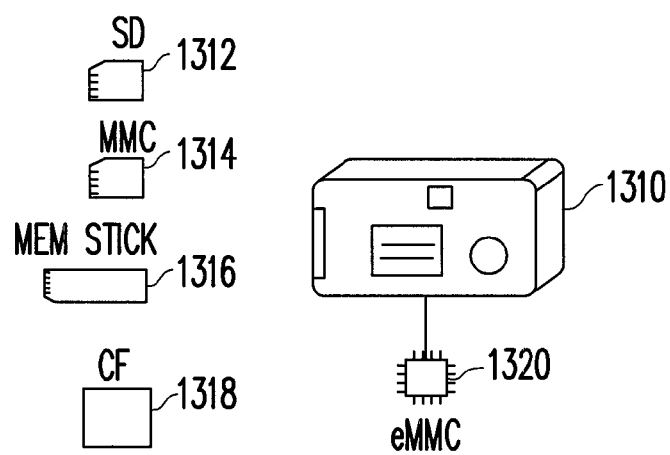
FIG. 1C is a diagram of a host system and a memory storage apparatus according to another exemplary embodiment of the invention.

Generally speaking, the host system 1000 is substantially any system that can work together with the memory storage apparatus 100 to store data. Even tough the host system 1000 is described as a computer system in the present exemplary embodiment, in another exemplary embodiment of the invention, the host system 1000 may also be a digital camera, a video camera, a communication device, an audio player, or a video player. For example, if the host system is a digital camera (video camera) 1310, the rewritable flash memory storage apparatus is then a secure digital (SD) card 1312, a multi media card (MMC) card 1314, a memory stick (MS) 1316, a compact flash (CF) card 1318, or an embedded storage device 1320 (as shown in FIG. 1C) used by the digital camera (video camera) 1310. The embedded storage device 1320 includes an embedded MMC (eMMC). It should be mentioned that the eMMC is directly coupled to the motherboard of the host system.

Figure 2:
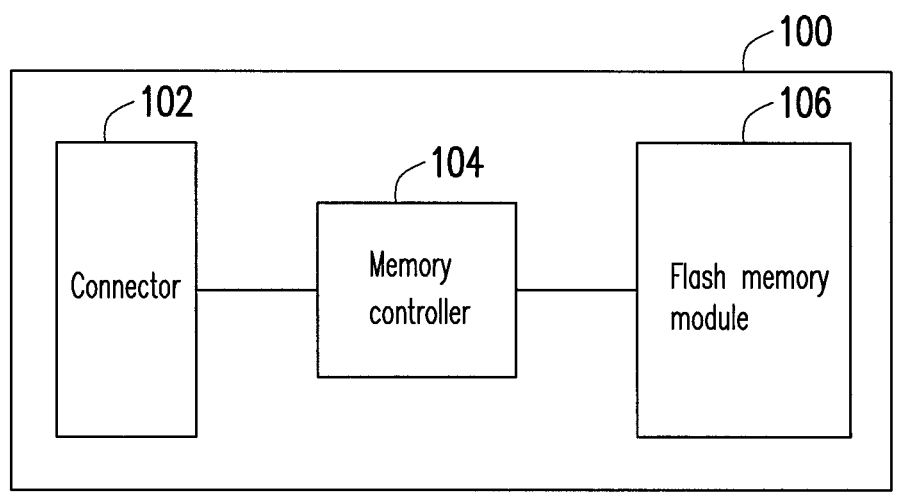
FIG. 2 is a schematic block diagram of the memory storage apparatus in FIG. 1A.

FIG. 2 is a schematic block diagram of the memory storage apparatus in FIG. 1A.

Referring to FIG. 2, the memory storage apparatus 100 includes a connector 102, a memory controller 104, and a flash memory module 106.

In the present exemplary embodiment, the connector 102 is compatible to the serial advanced technology attachment (SATA) standard. However, the invention is not limited thereto, and the connector 102 may also be compatible to the Institute of Electrical and Electronic Engineers (IEEE) 1394 standard, the peripheral component interconnect (PCI) express standard, the universal serial bus (USB) standard, the SD interface standard, the MS interface standard, the MMC interface standard, the CF interface standard, the integrated device electronics (IDE) standard, or any other suitable standard.

The memory controller 104 executes a plurality of logic gates or control instructions implemented in a hardware form or a firmware form and performs various data operations on the flash memory module 106 according to commands received from the host system 1000. It should be noted that in an exemplary embodiment of the invention, a reference frequency used by the connector 102 and the memory controller 104 is generated by calibrating an internal oscillator circuit according to a packet information received from the host system 1000 but not from a crystal oscillator in the memory storage apparatus 100. In another exemplary embodiment of the invention, the memory storage apparatus 100 does not include a crystal oscillator.

The flash memory module 106 is coupled to the memory controller 104 and configured to store data written by the host system 1000. In the present exemplary embodiment, the flash memory module 106 is a multi level cell (MLC) NAND flash memory module. However, the invention is not limited thereto, and the flash memory module 106 may also be a single level cell (SLC) NAND flash memory module, any other flash memory module, or any memory module having the same characteristics.

Figure 3:
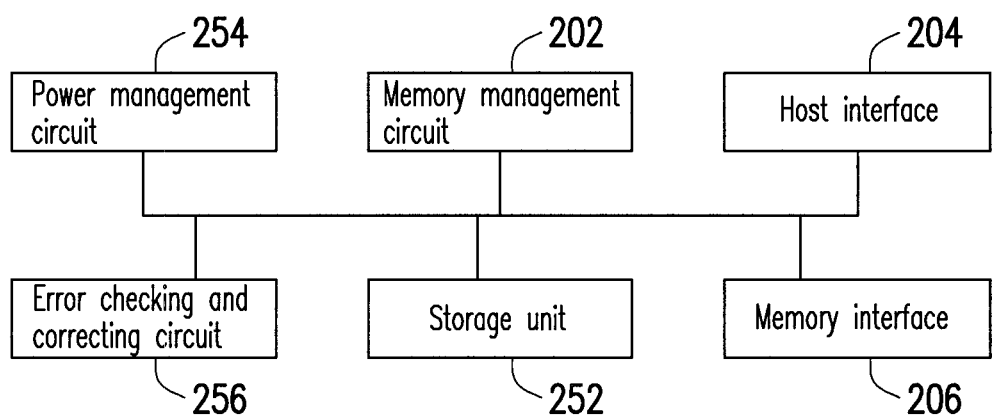
FIG. 3 is a schematic block diagram of a memory controller according to an exemplary embodiment of the invention.

FIG. 3 is a schematic block diagram of a memory controller according to an exemplary embodiment of the invention.

Referring to FIG. 3, the memory controller 104 includes a memory management circuit 202, a host interface 204, and a memory interface 206.

The memory management circuit 202 controls the overall operation of the memory controller 104. To be specific, the memory management circuit 202 has a plurality of control instructions, and when the memory storage apparatus 100 is in operation, the control instructions are executed to perform various data operations.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. When the memory storage apparatus 100 is in operation, the control instructions are executed by the microprocessor unit to carry out various data operations.

In another exemplary embodiment of the invention, the control instructions of the memory management circuit 202 may also be stored in a specific area of the flash memory module 106 (for example, a system area exclusively used for storing system data in a memory module) as program codes. In addition, the memory management circuit 202 has a microprocessor unit (not shown), a ROM (not shown), and a RAM (not shown). In particular, the ROM has driver codes. When the memory controller 104 is enabled, the microprocessor unit first executes the driver codes to load the control instructions from the flash memory module 106 into the RAM of the memory management circuit 202. Thereafter, the microprocessor unit runs the control instructions to carry out various data operations. Moreover, in yet another exemplary embodiment of the invention, the control instructions of the memory management circuit 202 may also be implemented in a hardware form.

The host interface 204 is coupled to the memory management circuit 202 and configured to receive and identify commands and data from the host system 1000. Namely, commands and data transmitted by the host system 1000 are transmitted to the memory management circuit 202 through the host interface 204. In the present exemplary embodiment, the host interface 204 is compatible to the SATA standard. However, the invention is not limited thereto, and the host interface 204 may also be compatible to the PATA standard, the IEEE 1394 standard, the PCI express standard, the USB standard, the SD standard, the MS standard, the MMC standard, the CF standard, the IDE standard, or any other suitable data transmission standard.

The memory interface 206 is coupled to the memory management circuit 202 and configured to access the flash memory module 106. Namely, data to be written into the flash memory module 106 is converted by the memory interface 206 into a format acceptable to the flash memory module 106.

In an exemplary embodiment of the invention, the memory controller 104 further includes a storage unit 252. The storage unit 252 is coupled to the memory management circuit 202 and configured to store system data and temporarily store data and commands from the host system 1000 or data from the flash memory module 106.

In an exemplary embodiment of the invention, the memory controller 104 further includes a power management circuit 254. The power management circuit 254 is coupled to the memory management circuit 202 and configured to control the power supply of the memory storage apparatus 100.

In an exemplary embodiment of the invention, the memory controller 104 further includes an error checking and correcting (ECC) circuit 256. The ECC circuit 256 is coupled to the memory management circuit 202 and configured to execute an ECC procedure to ensure data accuracy. To be specific, when the memory management circuit 202 receives a write command from the host system 1000, the ECC circuit 256 generates a corresponding ECC code for the data corresponding to the write command, and the memory management circuit 202 writes the data corresponding to the write command and the corresponding ECC code into the flash memory module 106. Subsequently, when the memory management circuit 202 reads data from the flash memory module 106, it also reads the ECC code corresponding to the data, and the ECC circuit 256 executes the ECC procedure on the data according to the ECC code.

Figure 4:
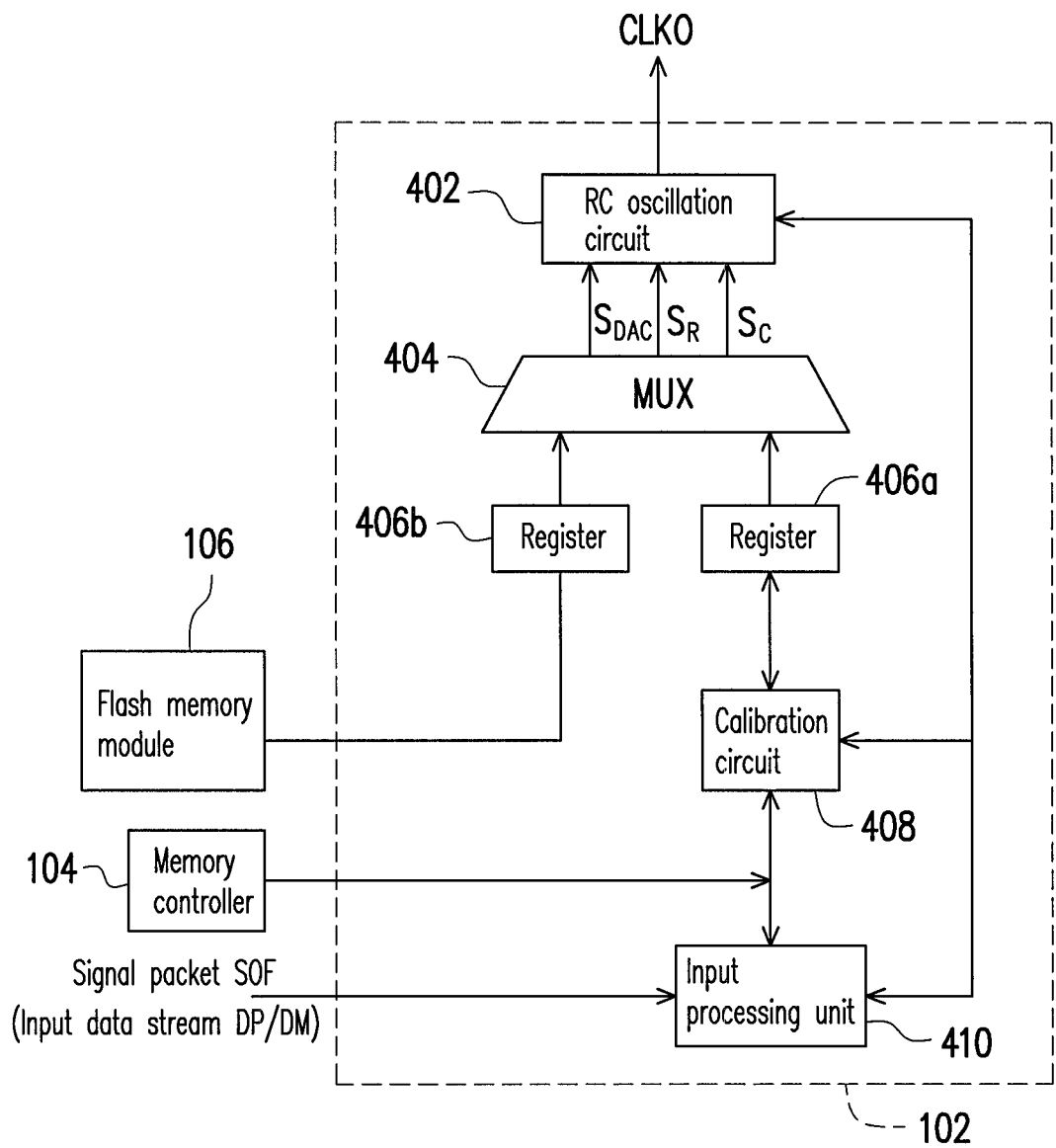
FIG. 4 is a schematic block diagram of an oscillator circuit according to an exemplary embodiment of the invention.

FIG. 4 is a schematic block diagram of an oscillator circuit according to an exemplary embodiment of the invention. Referring to FIG. 2 to FIG. 4, in the present embodiment, the oscillator circuit 402 may be an oscillator circuit in a chip in the memory storage apparatus 100, and which may be disposed inside the connector 102 for generating a reference frequency CLKO. In the present embodiment, the oscillator circuit 402 may be a resistor/capacitor (RC) oscillator, a ring oscillator, or an inductor/capacitor (LC) oscillator that can generate the reference frequency CLKO.

In order to allow the oscillator circuit 402 to provide an accurate reference frequency CLKO, the manufacturer thereof can preset an intermediate value of the reference frequency in a register 406a, and the characteristic of the oscillator circuit in the chip can be calibrated through a calibration circuit 408 during the activation procedure to make the frequency of the oscillator circuit to conform to the specification of the memory storage apparatus 100. Thus, when the oscillator circuit 402 in the chip is calibrated, the memory controller 104 first temporarily turns off a channel for receiving signals from a register 406b in a multiplexer 404. Then, the calibration circuit 408 calibrates the characteristic of the oscillator circuit 402 according to a capacitance calibration signal $S_C$, a resistance calibration signal $S_R$, or a digital-to-analog conversion (DAC) signal $S_{DAC}$. Herein the oscillator circuit 402 may be calibrated by connecting different number of resistors in parallel and different number of capacitors in series to generate different reference frequency CLKO. In the present embodiment, the memory controller 104 sets the reference frequency CLKO generated by the oscillator circuit 402 as a basic frequency of a signal packet SOF provided by a host. Herein the signal packet SOF is a start-of-frame (SOF) token.

To be specific, an input processing unit 410 receives an input data stream DP/DM from the host to calibrate the reference frequency CLKO generated by the oscillator circuit 402, wherein the signal packet SOF is carried by the input data stream DP/DM. The calibration circuit 408 may be a logic circuit, and which includes a counter (not shown) for calculating the interval between adjacent signal packets SOF. According to the specification of USB 2.0, the interval between two high-speed USB signal packets SOF is 125 micro-seconds. Every time when the calibration circuit 408 receives a signal packet SOF, it compares the interval counted by the counter with 125 micro-seconds. If the interval counted by the counter is smaller than the expected 125 micro-seconds, it is determined that the oscillator circuit 402 in the chip has a lower oscillation frequency. Accordingly, the number of resistors that are connected in parallel should be increased or the number of capacitors that are connected in series should be reduced to increase the oscillation frequency of the oscillator circuit 402 in the chip. Contrarily, if the interval counted by the counter is greater than the expected 125 micro-seconds, it is determined that the oscillator circuit 402 in the chip has a higher oscillation frequency. Accordingly, the number of resistors that are connected in parallel should be reduced or the number of capacitors that are connected in series should be increased to reduce the oscillation frequency of the oscillator circuit 402 in the chip. Thereby, the frequency of the oscillator circuit 402 can be controlled to be an accurate frequency after a continuous signal packet SOF is received.

Figure 5:
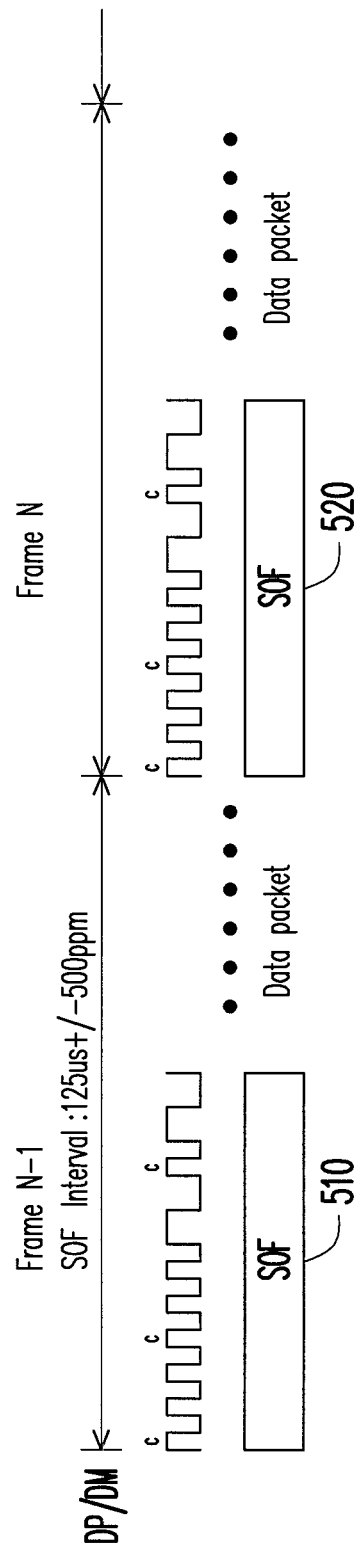
FIG. 5 illustrates a waveform of a start-of-frame (SOF) token according to an exemplary embodiment of the invention.

FIG. 5 illustrates a waveform of a SOF token according to an exemplary embodiment of the invention. Referring to FIG. 5, a frame N and a frame N−1 in the input data stream DP/DM are illustrated, and a SOF token 510 and a SOF token 520 are respectively attached ahead to the data packets of the two frames such that the input processing unit 410 can identify the frames N and N−1. In the present exemplary embodiment, based on the specification of USB 2.0, the interval between the SOF tokens 510 and 520 is 125 micro-seconds, and the error range thereof is +/−500 ppm. However, the invention is not limited thereto, and the interval may also be 225 micro-seconds or determined according to a different specification.

In the present embodiment, the input processing unit 410 receives the signal packet SOF carried by the input data stream DP/DM, and the calibration circuit 408 counts the signal packet SOF through the counter thereof to generate the capacitance calibration signal $S_C$, the resistance calibration signal $S_R$, or the digital-to-analog conversion (DAC) signal $S_{DAC}$.

For example, assuming the standard reference clock frequency to be 480 MHz and the interval between SOF tokens to be 125 micro-seconds, the number of SOF tokens within a clock cycle should be 60000. However, actually, if the clock frequency of the reference clock signal is lower than 480 MHz, the number of SOF tokens within a clock cycle is then smaller than 60000. In this case, the calibration circuit 408 needs to control the oscillator circuit 402 to increase the clock frequency of the reference clock signal by increasing the number of resistors that are connected in parallel or reducing the capacitance (for example, increasing the number of capacitors that are connected in series or reducing the number of capacitors that are connected in parallel). Contrarily, if the clock frequency of the reference clock signal is higher than 480 MHz, the number of SOF tokens within a clock cycle is then greater than 60000. In this case, the calibration circuit 408 needs to control the oscillator circuit 402 to reduce the clock frequency of the reference clock signal by reducing the number of resistors that are connected in parallel or increasing the capacitance (for example, reducing the number of capacitors that are connected in series or increasing the number of capacitors that are connected in parallel). Through the calibration method described above, the reference frequency generated by the oscillator circuit 402 can be eventually made close to the 480 MHz in the standard state.

In the present embodiment, besides being calibrated through the method described above, the reference frequency CLKO may also be calibrated by establishing a mapping table and reducing the number of calibration times.

Once a reference frequency close to the standard state is set, the memory controller 104 turns on the channel for accessing the register 406b through the multiplexer 404 again to store the setting and calibration information of the reference frequency into the register 406b. Thereafter, the memory controller 104 records the reference frequency in the flash memory module 106 as a firmware, so as to reduce the hardware cost of the memory storage apparatus 100.

In other words, in the present embodiment, the memory controller 104 stores a setting code into the flash memory module 106, wherein the setting code contains information of the reference frequency (i.e., information for setting components inside the oscillator circuit 402 to achieve the reference frequency as the oscillation frequency of the oscillator circuit 402). Then, when the memory storage apparatus 100 is turned on, the memory controller 104 reads the setting code again to control the oscillator circuit 402 to generate the reference frequency close to the standard state according to the setting code. In the present embodiment, the setting code is stored in the flash memory module 106. However, the invention is not limited thereto, and in other embodiments, the setting code may also be stored in the storage unit 252.

Figure 6:
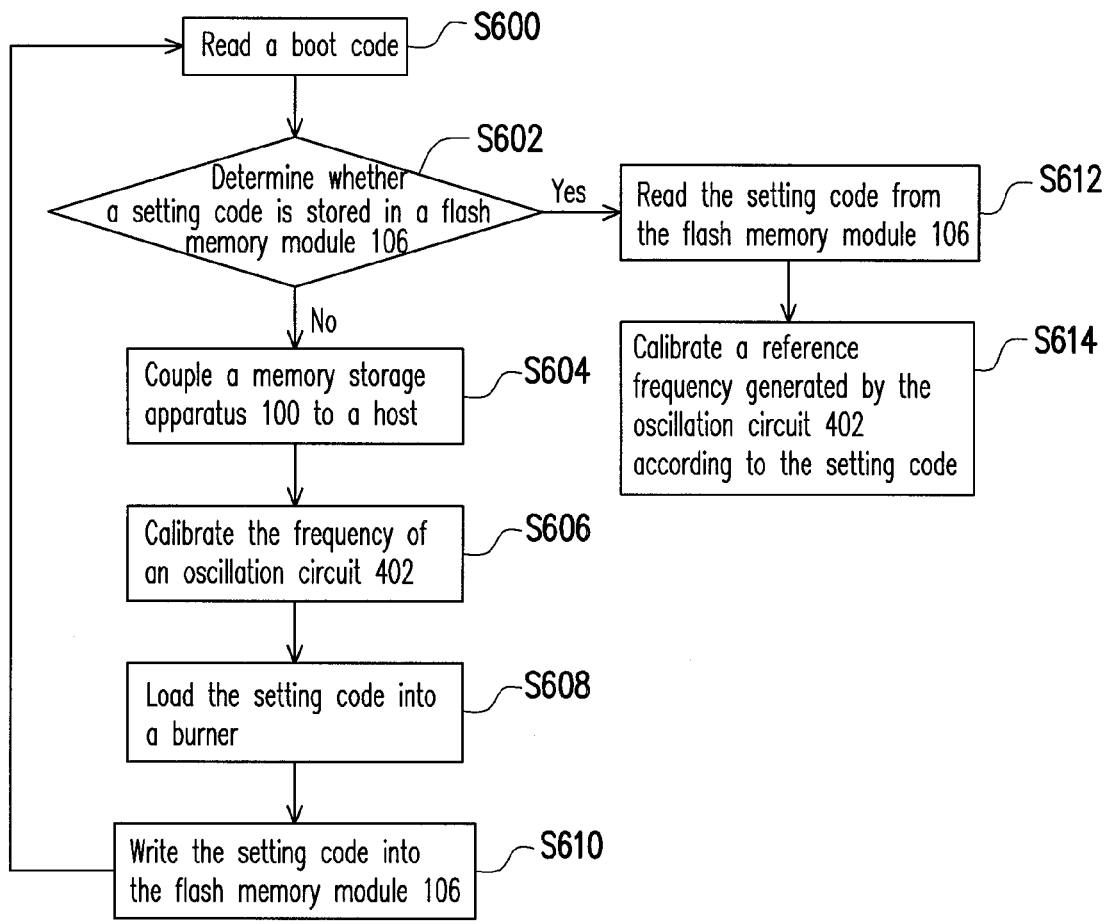
FIG. 6 is a flowchart of a reference frequency setting method according to an exemplary embodiment of the invention.

FIG. 6 is a flowchart of a reference frequency setting method according to an exemplary embodiment of the invention. Referring to FIG. 6, in the present embodiment, the storage unit 252 includes a memory unit (not shown) such as a buffer memory, a read only memory (ROM), a random access memory (RAM), or a register. The memory storage apparatus 100 stores or sends the boot code to the memory unit in the storage unit 252. In the present embodiment, the memory storage apparatus 100 may be a flash memory storage apparatus.

In step S600, after the memory storage apparatus 100 is turned on, the memory controller 104 reads the boot code to determine whether the setting code for setting the reference frequency is stored in the flash memory module 106 according to the boot code (step S602). The setting code may be obtained through the reference frequency setting and calibration method described above and stored in the flash memory module 106. In another embodiment, the setting code may also be stored in the storage unit 252. In this case, the memory controller 104 determines whether the setting code is stored in the storage unit 252.

Next, if the setting code is not stored in the flash memory module 106, the memory controller 104 couples the memory storage apparatus to a host to store the setting code into the flash memory module 106. In the present embodiment, the host connected to the memory storage apparatus 100 may be a special tool (usually provided by the manufacturer of the memory controller) for executing the activation procedure. To be specific, if it is determined in step S602 that the setting code is not stored in the flash memory module 106, in step S604, the memory controller 104 couples the memory storage apparatus 100 to the host to generate the setting code.

During the coupling process, the memory controller 104 controls the built-in hardware calibration circuit 408 to calibrate the frequency of the oscillator circuit 402 according to a signal packet provided by the host, so as to obtain the setting code containing the information of a frequency calibration range, as in step S606. In the present embodiment, the calibration circuit 408 calibrates the frequency of the oscillator circuit 402 in the chip by referring to the signal packet SOF carried by the input data stream DP/DM and stores the frequency calibration range into the register 406a. Namely, the calibration circuit 408 receives the signal packet SOF to calibrate the frequency of the oscillator circuit 402, so as to set the reference frequency as a basic frequency of the signal packet SOF.

Thus, after the setting code is successfully stored, in step S608, the memory controller 104 loads the setting code into a burner (not shown). After that, in step S610, the burner reads the setting code to write the setting code into the flash memory module 106. After the burner finishes executing its procedure, the memory storage apparatus 100 is turned on again. Herein the procedure of the reference frequency setting method returns to step S600 to determine whether the setting code is stored in the flash memory module 106 again according to the boot code.

In other embodiments, if the setting code is not stored in the flash memory module 106, the memory storage apparatus 100 may also record the calibration setting of the reference frequency into an e-fuse or a trim pad or through the reference frequency setting method provided by the invention.

On the other hand, if the memory controller 104 determines that the setting code is stored in the flash memory module 106 in step S602, in step S612, the memory controller 104 reads the setting code from the flash memory module 106 and stores the information of the frequency calibration range in the setting code into the register 406b to calibrate the oscillator circuit 402. Next, in step S614, the calibration circuit 408 calibrates the frequency of the oscillator circuit 402 according to the information of the frequency calibration range, so as to set the reference frequency generated by the oscillator circuit 402 as a basic frequency of the signal packet SOF. Thereafter, the memory controller 104 connects the memory storage apparatus 100 to the host to execute commands issued by the host.

It should be mentioned that the flash memory module 106 in embodiments of the invention may be a MLC NAND flash memory, and each physical block in a MLC NAND flash memory can be programmed in multiple phases. Taking a 4-bit-per-cell memory cell as an example, the programming of each physical block can be carried out in two phases. During the first phase, data is written into lower pages, and the physical characteristic of the lower pages is similar to that of a SLC NAND flash memory. The upper pages are programmed after the first phase is completed. Because the write speed of the lower pages is faster than that of the upper pages, the pages in each physical block can be categorized into slow pages (i.e., the upper pages) and fast pages (i.e., the lower pages). Similarly, an 8-bit-per-cell memory cell or a 16-bit-per-cell memory cell includes more pages and accordingly is programmed in more phases. Herein the page having the fastest write speed is referred to as the lower page, and other pages having slower write speeds are all referred to as upper pages. The upper pages may include multiple pages having different write speeds. Additionally, in other embodiments, the upper page(s) may also be defined as the page having the slowest write speed or the page having the slowest write speed and some pages having their write speeds faster than the slowest write speed. For example, in a 4-bit-per-cell memory cell, the lower pages are the pages having the fastest write speed and the second fastest write speed, and the upper pages are the pages having the slowest write speed and the second slowest write speed. Thus, in step S610 of the present embodiment, the memory controller 104 can store the setting code into the lower pages (which have a faster write speed) of the flash memory module 106 to increase the write speed.

In summary, in exemplary embodiments of the invention, when an activation procedure is executed on a memory storage apparatus, an accurate reference frequency is provided through a host, the frequency setting desired by an oscillator circuit in a chip of the memory storage apparatus is calibrated, and the frequency setting is stored into a flash memory module. Thereby, the reference frequency setting method provided by an exemplary embodiment of the invention can store the setting information of the reference frequency into the flash memory module as a firmware, so that the hardware cost of the memory storage apparatus can be reduced.

The previously described exemplary embodiments of the present invention have many advantages, including reducing the hardware cost of the memory storage apparatus, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

It is to be noted that the term "a" or "an" entity, in the following claims, refers to one or more of that entity. As such, the terms "a" (or "an"), "one or more" and "at least one" can be used interchangeably herein.

What is claimed is:

1. A reference frequency setting method of a flash memory storage apparatus, wherein the flash memory storage apparatus comprises a flash memory module, a storage unit, and an oscillator circuit, the reference frequency setting method comprising:
   determining whether a setting code is stored in the flash memory module or the storage unit in order to determine whether to generate the setting code, wherein the setting code comprises setting information of a reference frequency;
   if the setting code is stored in the flash memory module or the storage unit, reading the setting code to allow the oscillator circuit to generate the reference frequency according to the setting code, wherein the oscillator circuit does not include a crystal and does not receive a clock signal generated from a crystal oscillator; and
   if the setting code is not stored in the flash memory module, generating the setting code by a host removeably coupled with the flash memory storage apparatus and storing the setting code into the flash memory module.

2. The reference frequency setting method according to claim 1, wherein the storage unit stores a boot code, and in the step of determining whether the setting code is stored in the flash memory module or the storage unit, whether the setting code is stored in the flash memory module or the storage unit is determined according to the boot code after the flash memory storage apparatus is turned on.

3. The reference frequency setting method according to claim 1, wherein the setting code is generated by calibrating a frequency of the oscillator circuit according to a signal packet provided by the host, wherein the setting code comprises information of a frequency calibration range.

4. The reference frequency setting method according to claim 3, wherein the step of calibrating the frequency of the oscillator circuit comprises:
   receiving the signal packet to set the reference frequency generated by the oscillator circuit as a basic frequency of the signal packet.

5. The reference frequency setting method according to claim 3 further comprising:
   loading the setting code into a burner to write the setting code into the flash memory module or the storage unit by using the burner.

6. The reference frequency setting method according to claim 3, wherein the step of calibrating the frequency of the oscillator circuit comprises:
   setting the reference frequency generated by the oscillator circuit as a basic frequency of a signal packet provided by a host, which is in accordance with the setting code.

7. The reference frequency setting method according to claim 1, wherein a physical block of the flash memory module has a plurality of upper pages and a plurality of lower pages that have a write speed faster than a write speed of the upper pages, and the setting code is stored in the lower pages of the flash memory module.

8. A memory controller, for setting a reference frequency of a flash memory storage apparatus, wherein the flash memory storage apparatus comprises a flash memory module and an oscillator circuit, the memory controller comprising:

a memory interface, coupled to the flash memory module;
a memory management circuit, coupled to the memory interface; and
a storage unit, coupled to the memory management circuit,
wherein the memory management circuit determines whether a setting code is stored in the flash memory module or the storage unit in order to determine whether to generate the setting code, and the setting code comprises information of the reference frequency; and
if the setting code is stored in the flash memory module or the storage unit, the memory management circuit reads the setting code to allow the oscillator circuit to generate the reference frequency according to the setting code, wherein the oscillator circuit does not include a crystal and does not receive a clock signal generated from a crystal oscillator; and
if the setting code is not stored in the flash memory module or the storage unit, the memory management circuit generates the setting code through a host removeably coupled with the flash memory storage apparatus and stores the setting code into the flash memory module or the storage unit.

9. The memory controller according to claim 8, wherein the storage unit stores a boot code, and the memory management circuit determines whether the setting code is stored in the flash memory module or the storage unit according to the boot code after the flash memory storage apparatus is turned on.

10. The memory controller according to claim 8, wherein the memory management circuit generates the setting code by calibrating a frequency of the oscillator circuit according to a signal packet provided by the host, wherein the setting code further comprises information of a frequency calibration range.

11. The memory controller according to claim 10, wherein the memory management circuit receives the signal packet to set the reference frequency generated by the oscillator circuit as a basic frequency of the signal packet.

12. The memory controller according to claim 10, wherein the memory management circuit loads the setting code into a burner to write the setting code into the flash memory module or the storage unit through the burner.

13. The memory controller according to claim 8, wherein the memory management circuit sets the reference frequency generated by the oscillator circuit as a basic frequency of a signal packet provided by a host, which is in accordance with the setting code.

14. The memory controller according to claim 8, wherein a physical block of the flash memory module has a plurality of upper pages and a plurality of lower pages that have a write speed faster than a write speed of the upper pages, and the setting code is stored in the lower pages of the flash memory module.

15. A flash memory storage apparatus, comprising:
an oscillator circuit, configured to generate a reference frequency according to a setting code;
a flash memory module, configured to store the setting code; and
a memory controller, coupled to the oscillator circuit and the flash memory module, the memory controller comprising a storage unit,
wherein the memory controller determines whether the setting code is stored in the flash memory module or the storage unit in order to determine whether to generate the setting code, and the setting code comprises information of the reference frequency; and
if the setting code is stored in the flash memory module or the storage unit, the memory controller reads the setting code to allow the oscillator circuit to generate the reference frequency according to the setting code, wherein the oscillator circuit does not include a crystal and does not receive a clock signal generated from a crystal oscillator; and
if the setting code is not stored in the flash memory module or the storage unit, the memory controller generates the setting code through a host removeably coupled with the flash memory storage apparatus and stores the setting code into the flash memory module or the storage unit.

16. The flash memory storage apparatus according to claim 15, wherein the storage unit stores a boot code, and the memory controller determines whether the setting code is stored in the flash memory module or the storage unit according to the boot code after the flash memory storage apparatus is turned on.

17. The flash memory storage apparatus according to claim 15, wherein the memory controller generates the setting code by calibrating a frequency of the oscillator circuit according to a signal packet provided by the host, wherein the setting code further comprises information of a frequency calibration range.

18. The flash memory storage apparatus according to claim 17, wherein the memory controller receives the signal packet to set the reference frequency generated by the oscillator circuit as a basic frequency of the signal packet.

19. The flash memory storage apparatus according to claim 17, wherein the memory controller loads the setting code into a burner to write the setting code into the flash memory module or the storage unit through the burner.

20. The flash memory storage apparatus according to claim 15, wherein the memory controller sets the reference frequency generated by the oscillator circuit as a basic frequency of a signal packet provided by a host according to the setting code.

21. The flash memory storage apparatus according to claim 15, wherein a physical block of the flash memory module has a plurality of upper pages and a plurality of lower pages that have a write speed faster than a write speed of the upper pages, and the setting code is stored in the lower pages of the flash memory module.

* * * * *